United States Patent
Leon Garcia et al.

(10) Patent No.: US 10,516,261 B2
(45) Date of Patent: Dec. 24, 2019

(54) INTERCONNECTION EQUIPMENT FOR A HIGH-VOLTAGE DC GRID

(71) Applicants: SUPERGRID INSTITUTE, Villeurbanne (FR); INSTITUT POLYTECHNIQUE DE GRENOBLE, Grenoble (FR); UNIVERSITÉ GRENOBLE ALPES, Saint Martin D'heres (FR)

(72) Inventors: William Leon Garcia, Lyons (FR); Alberto Bertinato, Lyons (FR); Pascal Tixador, Lyons (FR); Bertrand Raison, Lyons (FR); Bruno Luscan, Lyons (FR)

(73) Assignees: SUPERGRID INSTITUTE, Villeurbanne (FR); INSTITUT POLYTECHNIQUE DE GRENOBLE, Grenoble (FR); UNIVERSITE GRENOBLE ALPES, Saint Martin D'heres (FR)

( * ) Notice: Subject to any disclaimer, the term of this patent is extended or adjusted under 35 U.S.C. 154(b) by 51 days.

(21) Appl. No.: 15/767,236

(22) PCT Filed: Oct. 14, 2016

(86) PCT No.: PCT/FR2016/052656
§ 371 (c)(1),
(2) Date: Apr. 10, 2018

(87) PCT Pub. No.: WO2017/064434
PCT Pub. Date: Apr. 20, 2017

(65) Prior Publication Data
US 2019/0074685 A1 Mar. 7, 2019

(30) Foreign Application Priority Data
Oct. 16, 2015 (FR) ...................... 15 59921

(51) Int. Cl.
*H02H 7/26* (2006.01)
*H02H 7/28* (2006.01)
(Continued)

(52) U.S. Cl.
CPC ....... *H02H 7/268* (2013.01); *G01R 19/16528* (2013.01); *H02H 7/28* (2013.01);
(Continued)

(58) Field of Classification Search
CPC ........... G01R 19/16528; H01H 33/596; H02H 7/268; H02H 7/28; H02H 9/023; Y02E 40/60; Y02E 60/60; H02J 3/36
(Continued)

(56) References Cited

U.S. PATENT DOCUMENTS

| 5,121,281 A * | 6/1992 | Pham | ................. H01H 33/596 361/141 |
| 7,193,825 B2 * | 3/2007 | Darmann | ................. H01F 6/00 323/360 |

(Continued)

FOREIGN PATENT DOCUMENTS

| CN | 101741076 | 6/2010 |
| CN | 103474983 | 12/2013 |

(Continued)

OTHER PUBLICATIONS

Descloux et al. "Protection System for Meshed HVDC Network Using Superconducting Fault Current Limiters," 2013 IEEE Grenoble Conference, Jun. 16, 2013, pp. 1-5.

*Primary Examiner* — Nguyen Tran
*Assistant Examiner* — Demetries A Gibson
(74) *Attorney, Agent, or Firm* — Occhiuti & Rohlicek LLP

(57) ABSTRACT

An item of interconnection equipment for a high-voltage DC grid includes first and second terminals for connection to
(Continued)

first and second lines of a high-voltage DC grid, a third terminal for connection to a local station or a line of the high-voltage grid, a node connected to the first to third terminals, a first superconductor current limiter and a first controlled switch connected in series between the first terminal and the node, a second superconductor current limiter and a second controlled switch connected in series between the second terminal and the node, a third superconductor current limiter and a third controlled switch connected in series between the third terminal and the node, and a current injector configured to inject an electrical current into the node.

12 Claims, 4 Drawing Sheets

(51) Int. Cl.
*H02J 3/36* (2006.01)
*G01R 19/165* (2006.01)
*H02H 9/02* (2006.01)
*H01H 33/59* (2006.01)

(52) U.S. Cl.
CPC .............. *H02H 9/023* (2013.01); *H02J 3/36* (2013.01); *H01H 33/596* (2013.01); *Y02E 40/60* (2013.01); *Y02E 60/60* (2013.01)

(58) Field of Classification Search
USPC .......... 361/19, 62–66, 93.1, 93.5, 93.7–93.9; 307/102, 103, 82
See application file for complete search history.

(56) References Cited

U.S. PATENT DOCUMENTS

| | | | |
|---|---|---|---|
| 9,413,157 B2* | 8/2016 | Tahata | H02H 3/087 |
| 2012/0050928 A1 | 3/2012 | Johnston, Jr. | |
| 2012/0112713 A1* | 5/2012 | Kuehn | H02J 3/24 |
| | | | 323/207 |
| 2012/0299393 A1 | 11/2012 | Häfner et al. | |
| 2014/0002943 A1 | 1/2014 | Berggren et al. | |
| 2014/0022680 A1 | 1/2014 | Berggren et al. | |
| 2016/0190791 A1* | 6/2016 | Sim | H02H 3/06 |
| | | | 361/93.6 |
| 2017/0201094 A1* | 7/2017 | Hassan | H02J 3/36 |

FOREIGN PATENT DOCUMENTS

| | | |
|---|---|---|
| CN | 103956718 | 7/2014 |
| CN | 204391676 | 6/2015 |
| EP | 2908398 | 8/2015 |
| WO | WO2012/123015 | 9/2012 |
| WO | WO2015/024509 | 2/2015 |

* cited by examiner

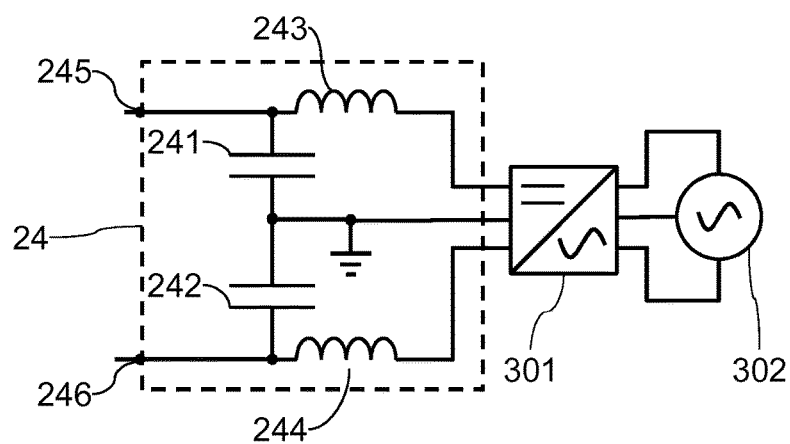
Fig. 9
Fig. 10
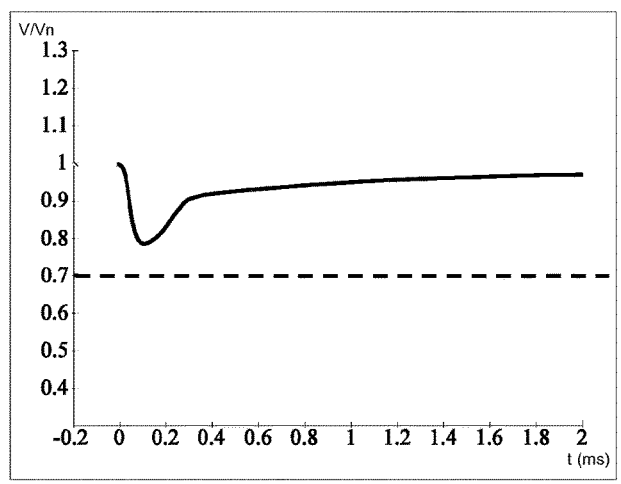

INTERCONNECTION EQUIPMENT FOR A HIGH-VOLTAGE DC GRID

CROSS REFERENCE TO RELATED APPLICATION

This application is the national phase under 35 USC 371 of international application no. PCT/FR2016/052656, filed Oct. 14, 2016, which claims the benefit of the Oct. 16, 2015 priority date of French application no. 1559921.

The invention relates to high-voltage direct current transmission and/or distribution networks, generally designated by the acronym HVDC. The invention relates in particular to the selectivity and the breaking time at the node faced with a short-circuit.

The HVDC networks are in particular considered as a solution to the interconnection of disparate or non-synchronous electricity production sites, emerging with the expansion of renewable energy. The HVDC networks are in particular considered for the transmission and the distribution of energy produced by offshore wind farms rather than the alternating current technologies, because of the lower in-line losses and the absence of incidence of stray capacitances of the network over long distances. Such networks typically have voltage levels of the order of 50 kV and above.

For the point-to-point transmission of electricity, a sectioning can be produced via an end-of-line converter, provided with a circuit breaker. By contrast, the sectioning can no longer be produced by such a converter in multipoint or multinode transmission. The breaking of direct current in such networks is a crucial issue directly conditioning the feasibility and the development of such networks. In effect, the appearance of a short-circuit at a node is propagated very rapidly throughout the network. In the absence of fairly rapid breaking at the node, the short-circuit current continues to grow and can reach several tens of kA in a few ms. The short-circuit can then exceed the breaking capacity of the direct current circuit breakers of the different nodes. The short-circuit current could also damage the power electronics used in the AC/DC converters.

One known solution consists in positioning a very rapid deep direct current circuit breaker in series with reactances, to limit the rate of growth of the short-circuit current and allow it to break in a very short time. A local voltage and current measurement at the circuit breaker makes it possible to control the opening thereof in case of the appearance of a short-circuit.

Such a solution induces not-inconsiderable losses and relies on the level of rapidity of the circuit breaker, which implies a particularly high circuit breaker cost. Furthermore, such a solution proves imperfect for obtaining a satisfactory selectivity of the breaking in case of short-circuit and has not been proven to ensure protection for multinode transmission.

The document published by Justine Descloux et al., 16 Jun. 2013, in the context of the IEEE conference in Grenoble in 2013, entitled 'Protection system for meshed HVDC network using superconducting fault current limiters', in pages 1 to 5, describes an interconnection equipment item for high-voltage direct current network. This item of equipment has first and second terminals for connecting to lines of a high-voltage network, a third terminal for connection to a local station, and a node connected to these terminals. A circuit breaker is connected between the first terminal and the node, another circuit breaker is connected between the second terminal and the node. A superconductor current limiter is connected between the third terminal and the node. Such a system makes it possible to neither locate nor rapidly isolate a failure.

The document EP2908398 describes a series switch structure for high-voltage networks. This switch comprises a controlled switch in series with a superconductor current limiter.

The document WO2012/123015 describes current limiters positioned at the intersection between sub-segments of a high-voltage direct current network, in order to avoid the propagation of a failure throughout the network.

The invention aims to resolve one or more of these drawbacks. The invention thus relates to an interconnection equipment item for a high-voltage direct current network, as defined in claim 1.

The invention relates also to the object of the dependent claims. The various features of the dependent claims can also be combined independently with the features of claim 1, without constituting an intermediate generalization.

The invention relates also to a high-voltage direct current electrical network, comprising:
high-voltage lines;
at least three interconnection equipment items as claimed, the first and second terminals of each of said interconnection equipment items being interconnected via said high-voltage lines.

Other features and advantages of the invention will emerge clearly from the description given thereof hereinbelow, in an indicative and nonlimiting manner, with reference to the attached drawings, in which:

FIG. 1 illustrates a simplified example of a high-voltage direct current network implementing interconnection equipment items according to the invention, associated with alternating current networks;

FIG. 2 schematically illustrates an exemplary embodiment of an interconnection equipment item according to the invention;

Figure 2:
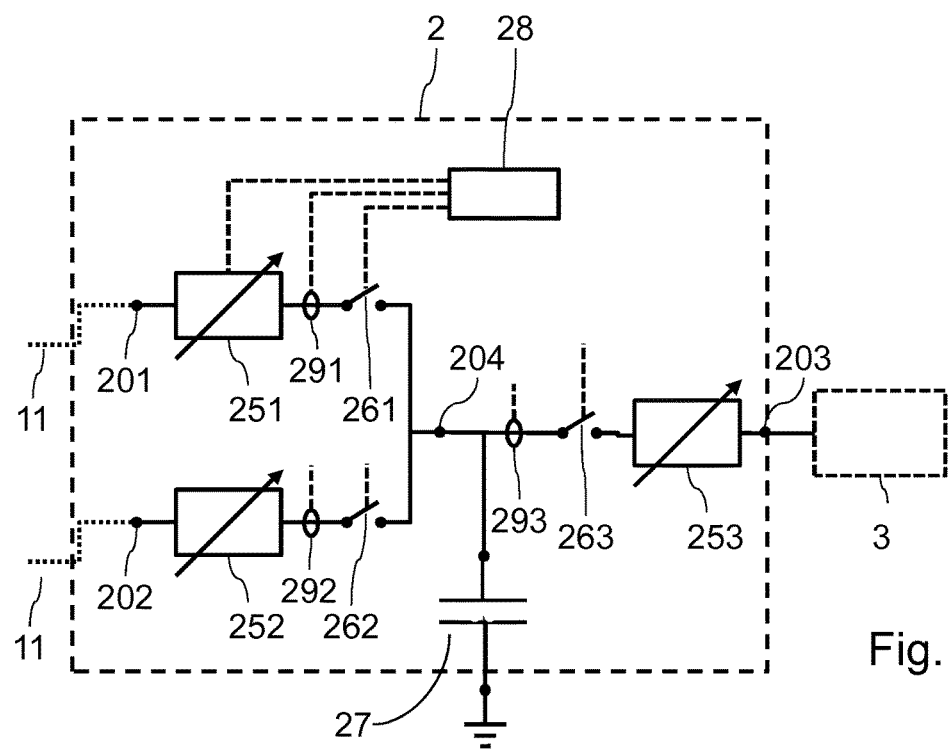
Figure 5:
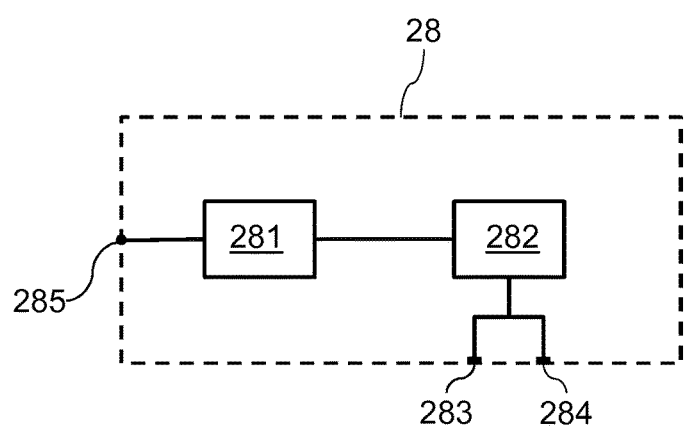
Figure 6:
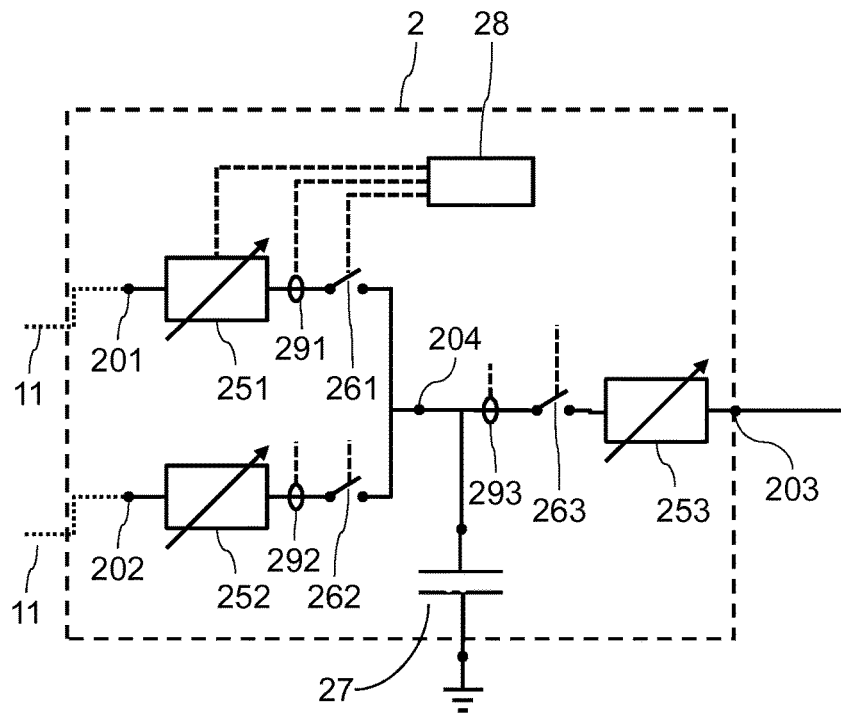
Figure 7:
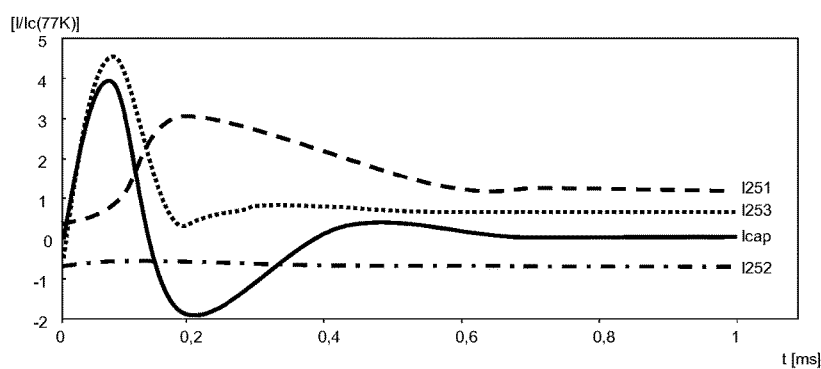
Figure 8:
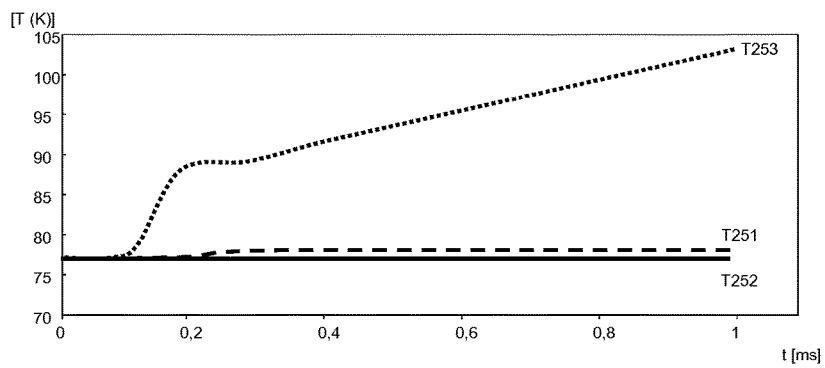

FIG. 5 schematically illustrates an example of a control device of an interconnection equipment item according to the invention;

FIG. 6 illustrates a particular case of short-circuit applied to an interconnection equipment item according to FIG. 2;

FIG. 7 is a diagram illustrating different currents upon the short-circuit applied to the interconnection equipment item of FIG. 2;

FIG. 8 is a diagram illustrating the temperature of different current limiters upon the short-circuit applied to the interconnection equipment item of FIG. 2;

FIG. 9 schematically illustrates a protection device of a local station;

FIG. 10 illustrates the ratio of voltage to nominal line voltage upon a short-circuit at a protection device according to another aspect of the invention.

The invention proposes an interconnection equipment item comprising at least three terminals connected to a node, the connection between each of its terminals and the node includes a superconductor current limiter and a controlled switch (or circuit breaker) connected in series. A device configured to inject an electrical current into the node upon a voltage drop on this node (in particular a capacitor connected between the node and the ground stores energy in the example detailed herein below) is intended to trip one of the current limiters on the terminal on which a short-circuit occurs. The energy injected by this device passes through this current limiter to the short-circuit, then the controlled switch connected in series is open. Thus, only this current limiter is tripped and not the other current limiters, a selectivity of the opening of the controlled switches being thus obtained.

Figure 1:
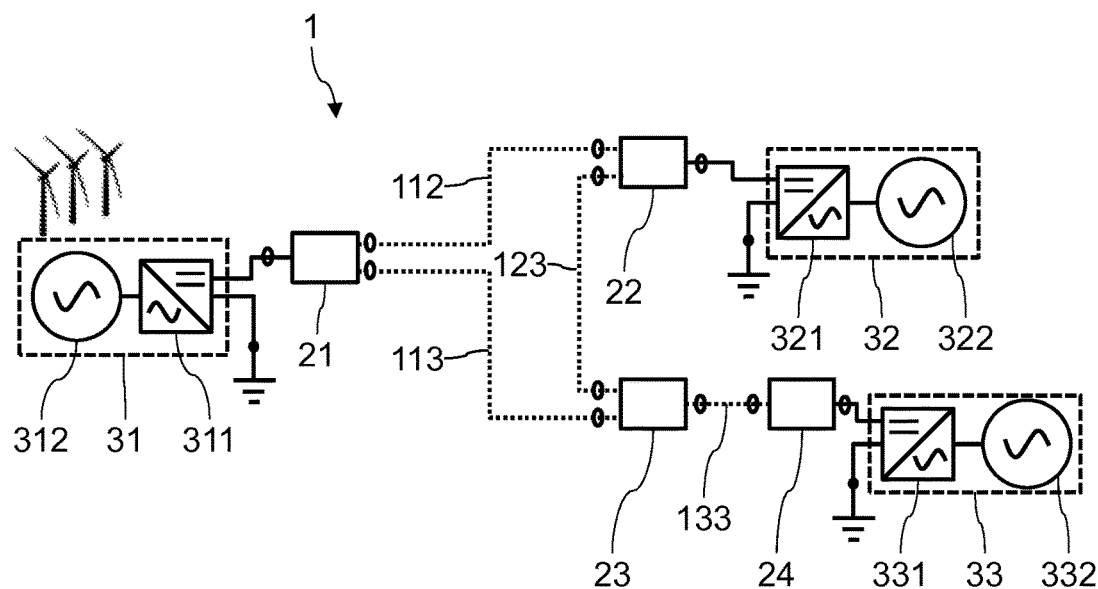

FIG. 1 is a simplified schematic representation of an example of a high-voltage direct current network 1 implementing interconnection equipment items 21, 22 and 23 according to the invention, the high-voltage direct current network 1 being associated with alternating current networks.

The network 1 comprises high-voltage lines 112, 113, 123 and 133. The high-voltage line 112 connects the equipment items 21 and 22, the high-voltage line 123 connects the equipment items 22 and 23, and the high-voltage line 113 connects the equipment items 21 and 23. The network 1 comprises local stations 31, 32 and 33.

The local stations 31, 32 and 33 can include, as is known per se, electrical generators (such as fields of wind turbines, tidal power stations, nuclear power stations, thermal power stations or even photovoltaic generators) or local transport or consumption networks.

The local stations 31, 32 and 33 here each comprise a DC/AC converter and an alternating current equipment item (generator or load) representing all of the local alternating current network in the interests of simplification. The local station 31 thus comprises a converter 311 connected to the equipment item 21 and a rotating machine 312 used as generator connected to the converter 311. The local station 32 comprises a converter 321 connected to the equipment item 22 and an alternating current equipment item 322 connected to the converter 321. The local station 33 comprises a converter 331 connected to the equipment item 23 and an alternating current equipment item 332 connected to the converter 331. The local station 33 is here connected to the equipment item 23 via a protection device 24 and a high-voltage line 133. The converters 311, 321 and 331 are advantageously of voltage source converter VSC type, for example of modular multi-level converter or MMC type, of half-bridge, full-bridge type or two-level voltage source converter. In the interests of simplification, only one polarity of the high-voltage network has been illustrated here. Each connection equipment item 31 to 33 can of course have terminals and components duplicated to manage the other polarity of the network.

FIG. 2 schematically illustrates an example of an embodiment of an interconnection equipment item 2. The interconnection equipment item 2 comprises a terminal 201 and a terminal 202 that are intended to be connected to respective high-voltage direct current lines 11, themselves connected to other interconnection equipment items. A third terminal 203 is intended to be connected to a local station 3 (but can be connected to another high-voltage line).

A node 204 is connected to the terminals 201, 202 and 203 via respective branches. The node 204 is thus connected:
  to the terminal 201 via a superconductor current limiter 251 and a controlled switch 261 connected in series;
  to the terminal 202 via a superconductor current limiter 252 and a controlled switch 262 connected in series;
  to the terminal 203 via a superconductor current limiter 253 and a controlled switch 263 connected in series.

The orders of connection of superconductor current limiter 251 and of the controlled switch 261 between the terminal 201 and the node 204, of the superconductor current limiter 252 and of the controlled switch 262 between the terminal 202 and the node 204, or of the superconductor current limiter 253 and of the controlled switch 263 between the terminal 203 and the node 204 can be transposed relative to the configuration illustrated. The current limiters 251 to 253 are configured to maintain the current passing through the controlled switches 261 to 263 at a level lower than the breaking capacity of these controlled switches, to thus allow the effective opening of one of these switches 261 to 263 in case of short-circuit. With current limiters 251 to 253 of the superconductor type, the latter have a zero potential difference between their terminals when they are in superconducting state, which therefore makes it possible to limit the losses induced in each branch. The current limiters 251 to 253 can either be composed of a current limiter component, or include a combination of components connected in a manner known per se in parallel or in series with a current limiter component, to obtain a current limitation function.

The control switches 261 to 263 are advantageously electromechanical switches, particularly because of the low in-line losses that they are capable of generating.

A capacitor 27 is connected between the ground and the node 204. In normal operation, the voltage at the terminals of the capacitor 27 is equal to the nominal voltage on the high-voltage lines 11.

The interconnection equipment item 2 also here comprises a control circuit 28 configured to selectively control the opening of each of the controlled switches 261 to 263. An example of control circuits 28 is for example schematically illustrated in FIG. 5. The control circuit 28 comprises, for example, a processing circuit 282. The processing circuit 282 is connected to an input interface 283 intended to receive a measurement of the current passing through a current limiter, and to an interface 284 intended to receive a measurement of voltage at the terminals of this current limiter. Dedicated interfaces will of course be able to be provided to measure these parameters for each of the current limiters. The processing circuit 282 is connected to a relay 281. The relay 281 is itself connected to an output interface 285. Through an appropriate command, the processing circuit 282 can apply an open command to the relay 281, the relay 281 then applying an open command to the output interface 285. The output interface 285 is connected to a control electrode of one of the controlled switches. Each of the controlled switches 261 to 263 can have an output interface and a relay that are dedicated. Each of the controlled switches 261 to 263 will be able to have a breaking time of between 10 and 50 ms (for example 25 ms), after reception of its open command.

The control circuit 28 here measures the current passing through each terminal 201 to 203, for example by measuring the current passing through each of the current limiters 251 to 253. When a measured current exceeds a threshold, for example the critical current of one of the current limiters 251 to 253, the control circuit 28 determines that a short-circuit is probably present at one of the terminals 201 to 203. The control circuit 28 here also measures the voltage at the terminals of each current limiter 251 to 253. When a voltage measured for a current limiter exceeds a threshold, the control circuit 28 determines that this current limiter is tripped, since a superconductor current limiter exhibits a substantially zero voltage in normal operation. When the control circuit 28 determines that the current threshold and the voltage threshold are exceeded for a current limiter, the control circuit 28 commands the opening of the controlled switch with which this current limiter is connected in series. Advantageously, the control circuit 28 calculates the square of the voltage measured at the terminals of each of the limiters 251 to 253. When the square of the voltage at the terminals of one of the limiters exceeds a threshold, the control circuit 28 can also command the opening of the controlled switch connected in series with this limiter. The square of the voltage at the terminals of a superconductor current limiter is in effect fairly representative of the runaway thereof. In the case of a short-circuit appearing at an intermediate level of a high-voltage line, this threshold will be exceeded for the current limiters present at the two ends of the line, with only a time offset between these current limiters, as a function of the respective distances separating them from the short-circuit. The control circuit 28 can alternatively calculate the ratio of the voltage measured at the terminals of each of the limiters 251 to 253 to the current passing through this respective limiter, to determine whether a resistance of a limiter has reached a runaway threshold. The control circuit 28 can alternatively calculate for each limiter 251 to 253 its value $I^2t$, with I the current passing through the limiter concerned and "t" the time, to detect any hotspots and highly resistive faults, when the fault current is close to the critical current of the limiter.

The energy stored in the capacitor 27 thus makes it possible to more easily trip the current limiter closest to the terminal on which the short-circuit is present, because of the voltage drop observed on the terminal exhibiting the short-circuit. The opening of the switch connected in series with this limiter can then be performed in a sufficiently short time before the other current limiters themselves induce the opening of their respective controlled switches.

Such an interconnection equipment item 2 proves advantageous since it makes it possible to break the current to isolate a terminal exhibiting a short-circuit without in any way requiring a communication between the different interconnection equipment items of the network. Furthermore, such an interconnection equipment item 2 makes it possible to make the network 1 clearly more robust from the viewpoint of selectivity in the following critical configurations:

- a (healthy) high-voltage line linked to the interconnection equipment item which undergoes the short-circuit is taken out of service (that is true when there are at least 3 connection terminals to high-voltage lines from the interconnection equipment item);
- the interconnection equipment item which undergoes the short-circuit is connected to a healthy overhead high-voltage line (that is true when there are at least 3 connection terminals to high-voltage lines from the interconnection equipment item);
- strong disparities in length of the high-voltage lines linked to an interconnection equipment item;
- a reversal of the current in the interconnection equipment item upon the occurrence of the short-circuit;
- strong disparities in the critical currents for the current limiters in one and the same interconnection equipment item of the network 1;
- the interconnection equipment item which undergoes the short-circuit is linked to a conversion station (true for an MMC converter for example).

Figure 3:
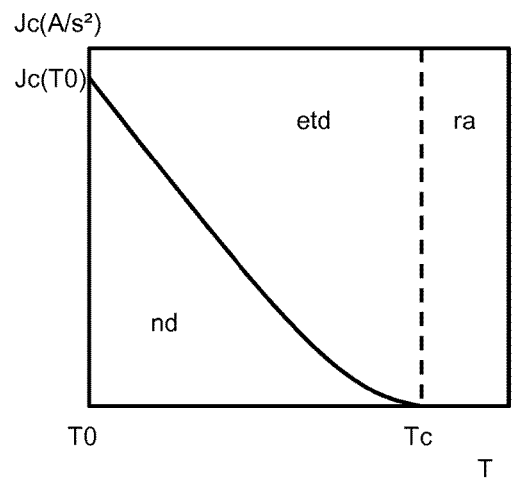
FIG. 3 illustrates a diagram of the mode of operation of a superconductor current limiter, as a function of its temperature and of its current density.
Figure 4:
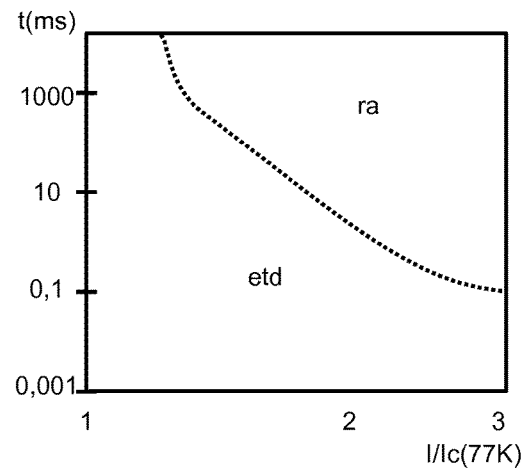
FIG. 4 illustrates a diagram of the mode of operation of a superconductor current limiter as a function of its current and of the holding time of this current.

The current limiters 251, 252 and 253 can be of the superconductor resistive type. Such limiters exhibit a zero resistance in normal operation and increase very strongly when they are tripped. The diagrams of FIGS. 3 and 4 are representative of an example of operation of such limiters. A superconductor resistor current limiter typically comprises a ribbon of superconductor material passed through by the nominal current between its terminals (for example for a limiter of YBCO type). The ribbon of superconductor material bathes in a bath of liquid nitrogen in order to keep it below its critical temperature before it is tripped.

FIG. 3 is a diagram illustrating the mode of operation of a superconductor resistor current limiter as a function of the current density which passes through it and of its temperature. In a first zone designated nd, the current limiter is non-dissipative, because of a low current density and a low temperature. In a second zone designated etd, the current limiter is in a dissipative state. In a third zone designated ra, the current limiter is in a very strongly dissipative and permanent thermal runaway state. It is in this state that the current limiter ensures most of its current limiting function.

FIG. 4 is a diagram illustrating the trip time as a function of the current passing through the current limiter (here illustrated by the current to critical current ratio).

According to the invention, the aim is to trip the current limiter closest to the terminal exhibiting the short-circuit so as to open its switch before the other current limiters of the equipment item have reached their runaway state, and do so in order to guarantee the continuity of service with the network 1 by virtue of the excellent selectivity obtained.

It is possible to determine dimensioning criteria for the capacitor 27 favoring the tripping of the appropriate current limiter. It will be possible to start from the hypothesis that the capacitor 27 must be able to supply a sufficient energy to allow the tripping of a current limiter (reaching the runaway temperature of the current limiter) before a certain delay. By assuming that the heat exchanges are substantially negligible during a runaway, it will then be considered that the current limiter is in adiabatic state during its runaway. The energy balance of the current limiter can then be formulated as follows:

$$\int_{t1}^{tmax} v_{sc(t)} \times i_{sc(t)} \times dt = \text{Vol} \times \int_{T0}^{Tmax} Cp_{(T)} \times dT$$

With Vsc(t) the voltage of the terminals of the limiter, $i_{sc}(t)$ the current passing through it, t1 the instant of occurrence of a fault, tmax the maximum instant of end of limiting, Tmax the maximum safety temperature, Vol the volume of the limiter, To the nominal operating temperature of the current limiter and Cp its volume heat capacity.

By assuming as hypothesis a trip instant (tquench) much earlier than the end-of-limiting instant (t1−tquench≪t1−tmax) the energy balance can be approximated as follows:

$$\int_{tquench}^{tmax} v_{sc(t)} \times i_{sc(t)} \times dt = \text{Vol} \times \int_{Tc}^{Tmax} Cp_{(T)} \times dT$$

The following is deduced therefrom:

$$V\text{grid} \times Ic \times \Delta t_{open} \approx \text{Vol} \times Cp_{moy(Tc-Tmax)} \times (Tmax-Tc) \quad [1]$$

With Vgrid the voltage of the high-voltage network, Ic the limiting current or critical current, Tc the trip temperature or critical temperature of the limiter, Δtopen the maximum limiting time (tmax−tquench) and Cpmoy the average heat capacity between Tc and Tmax.

The trip energy of a current limiter corresponds to the energy necessary to raise its temperature to the temperature Tc as follows:

$$E_{quench} = \int_{t1}^{tquench} v_{sc(t)} \times i_{sc(t)} \times dt = \text{Vol} \int_{T0}^{Tc} Cp_{(T)} dT$$

The following is deduced therefrom $$E_{quench} \approx \text{Vol} \times Cp_{moy(T0-Tc)} \times (Tc-T0) \quad [2]$$

The relationships [1] and [2] make it possible to estimate the trip energy of a current limiter from the parameters of the network as follows:

$$E_{quench} \approx (V\text{grid} \times Ic \times \Delta t_{open})/k$$

$$k = [\text{Vol} \times Cp_{moy(Tc-Tmax)} \times (Tmax-Tc)]/[\text{Vol} \times Cp_{moy(T0-Tc)} \times (Tc-T0)]$$

k≈20, typical value for a YBCO ribbon

The following is deduced therefrom:

$$E_{quench} \approx 0.05 \times V\text{grid} \times Ic \times \Delta t_{open}$$

Finally, the energy stored by the capacitor 27 has to make it possible to trip the current limiter with the critical current (Ic) that is the highest (Icmax) out of the different current limiters which compose the interconnection device, the latter will give the minimum capacitance value (Cmin) in the case where there are no other current sources.

$$E_{Cond} = 0.5 \times C \times V\text{grid}^2 \approx 0.05 \times V\text{grid} \times Ic \times \Delta t_{open}$$

The following is deduced therefrom:

$$C\min \approx (0.1 \times Ic_{max} \times \Delta t_{open})/V\text{grid}$$

For example, for a network with a voltage Vgrid of 320 kV, a critical current Ic of 2.25 kA and a maximum limiting time of 25 ms, the equation makes it possible to estimate a capacitance of 17.58 µF.

The current limiters 251 to 253 are preferably of second generation high-temperature superconductor type (designated 2G HTS). Such current limiters exhibit a great critical current uniformity over all the length of the material of which they are composed, with, for example, dispersions lower than 10%. Such uniformity proves preferable for strongly resistive faults.

FIG. 6 represents the interconnection equipment item 2 of FIG. 2 in an example of short-circuit configuration. In this example, the short-circuit is present at the connection with the terminal 203. The selectivity has to allow the opening of the controlled switch 263 before the activation of the current limiters 251 and 252, so as to maintain the interconnection of the high-voltage lines 11 via the node 204. The operation of the interconnection equipment item 2 will emerge more clearly on reading the diagrams of FIGS. 7 and 8.

FIG. 7 illustrates different current/critical current ratios as a function of time. Different impedances are present on the high-voltage lines connected to the current limiters 251 and 252. The simulation has here been performed with one and the same critical current for each of the current limiters 251 to 253. The standardized current Icap illustrated by a solid line illustrates the current passing through the capacitor 27. The broken line standardized current I251 represents the current through the current limiter 251. The chain dotted line standardized current I252 represents the current through the current limiter 252. The dotted line standardized current I253 represents the current through the current limiter 253. FIG. 8 illustrates the temperatures of the different superconductor current limiters, as a function of time.

Upon the occurrence of the short-circuit at the instant t=0, the capacitor 27 outputs through the current limiter 253 to the short-circuit. The current passing through the current limiter 253 reaches several times the critical current of the limiter 253, so as to create the runaway thereof and the tripping thereof. The impedance of the current limiter 253 increases, such that the current passing through the current limiter 253 then decreases, to a value close to around the critical current. Because of the increase in the voltage at the terminals of the current limiter 253 and in the current level passing through it, the control circuit 28 determines that the switch 263 must be open. The switch 263 can then be opened (not illustrated in the diagrams) with a current passing through it lower than its breaking capacity. In the meantime, the currents through the limiters 251 and 252 increase also. The tripping of the current limiter 253 makes it possible to keep the current limiters 251 and 252 outside of their runaway zone. It is thus not necessary to have particularly fast controlled switches 261 to 263, which makes the manufacturing cost of the interconnection equipment item 2 reasonable.

Each branch of the interconnection equipment item 2 will for example be able to be dimensioned for DC voltages at least equal to 10 kV, even at least equal to 50 kV, typically at least equal to 100 kV, and potentially at least equal to 300 kV, even 500 kV. Such a current breaking device will also be able to be dimensioned for a service direct current at least equal to 1 kA, even at least equal to 2 kA.

By having interconnection equipment items 2 at the ends of the different high-voltage lines, a selectivity is obtained to make it possible to first of all trip the interconnection equipment item closest to the short-circuit on this line, by virtue of the impedance differences on either side of the short-circuit.

FIG. 9 schematically illustrates a protection device 24 that can be connected to the input of a modular multi-level converter 301. The protection device 24 is advantageously used in combination with an interconnection equipment item 2, in order to protect the converter 301 and its AC equipment item or network 302. The protection device 24 comprises an input terminal 245 intended for connection to a high-voltage intermediate line of a first polarity. The protection device 24 also comprises an input terminal 246 intended for connection to a high-voltage intermediate line of a second polarity. These intermediate high-voltage lines are themselves connected to the interconnection equipment item 23, as illustrated in FIG. 1. An inductor 243 is connected between a first input of the converter 301 and the input terminal 245. An inductor 244 is connected between a second input of the converter 301 and the input terminal 246. A capacitor 241 is connected between the input terminal 245 and the ground. A capacitor 242 is connected between the input terminal 246 and the ground. The capacitors 241 and 242 make it possible for example to trip current limiters (not illustrated) and controlled switches of safety devices connected to the input terminals 245 and 246. The inductors 243 and 244 are in particular intended to guarantee the control of the converter 301 should a short-circuit occur in the network, particularly for the type of converter detailed previously. The aim is in particular to guarantee that the voltages at the terminals of the converter on the DC side 301 remain greater than the voltages on the AC side. The aim is in particular to retain a voltage on each direct current terminal that is at least equal to 0.7 times the nominal voltage on the high-voltage lines connected to the protection device 24. A reactance can be placed at the output of the converter, to facilitate the control of the converter during the fault, particularly for a multilevel converter of half-bridge type.

With a nominal voltage level of 320 kV on these high-voltage lines, with a length of 350 km for these high-voltage lines, a simulation has made it possible to determine that capacitors 241 and 242 of 5 µF and inductors 243 and 244 of 10 mH would prove satisfactory. A simulation with such components is in particular illustrated in FIG. 10, for a short-circuit occurring at the converter 301. The diagram of FIG. 10 illustrates the ratio of the voltage on an input terminal to the nominal voltage of its high-voltage line, as a function of time.

The device for injecting current into the node of the interconnection equipment item 22 is a capacitor in the example detailed previously. It is also possible to envisage having the injection device formed by a DC/DC converter, configured to inject a current into the node 204 upon a voltage drop on this node, the converter being configured to inject a current with an energy Equench that bears out the relationship $$E_{quench} \geq 1/k \times Vi \times Ic \times \Delta t_{open}$$

with $$k=[Vol \times Cp_{moy(Tc-Tmax)} \times (Tmax-Tc)]/[Vol \times Cp_{moy(T0-Tc)} \times (Tc-T0)]$$

with Δtopen the maximum time tolerated for the fault. Δtopen will for example be able to be of the order of 10 ms, or of the order of 25 ms.

The invention claimed is:

1. An apparatus comprising an item of interconnection equipment for a high-voltage direct-current network, wherein said item of interconnection equipment comprises first, second, and third terminals, a node, a first current limiter, a second current limiter, a third current limiter, first, second and third controlled switches, and a current injector, wherein said first and second terminals are configured for connection to first and second lines of said high-voltage direct-current network, wherein said third terminal is configured for connection to a local station or to a line of the high-voltage network, wherein said node is connected to said first to third terminals, wherein said first current limiter and said first controlled switch are connected in series between said first terminal and said node, wherein said second current limiter and said second controlled switch are connected in series between said second terminal and said node, wherein said third current limiter and said third controlled switch are connected in series between said third terminal and said node, wherein said current injector is configured to inject an electrical current into said node upon a voltage drop on said node, and wherein said first, second, and third current limiters are superconductor current limiters.

2. The apparatus of claim 1, wherein said current injector is configured to inject a current with an energy that is greater than or equal to $1/k \times Vi \times Ic \times \Delta t_{open}$, wherein Vi is a nominal voltage on the first and second terminals, wherein Ic is a critical current of the limiter having the highest critical current out of the first current limiter, the second current limiter, and the third current limiter, wherein Δtopen is a maximum time tolerated for a fault, wherein $$k=[V \times Cp_{ave(Tc-Tmax)} \times (Tmax-Tc)]/[V \times Cp_{ave(T0-Tc)} \times (Tc-T0)],$$

wherein $Cp_{ave}$ is an average heat capacity between two temperatures for said current limiter, wherein $T_{max}$ is a maximum safety temperature of said current limiter, wherein $T_c$ is a trip temperature of said current limiter, wherein T0 is a nominal operating temperature of said current limiter, and wherein V is a volume of superconductor material in said current limiter.

3. The apparatus of claim 1, wherein said current injector comprises a capacitor connected between said node and ground.

4. The apparatus of claim 1, wherein one of said first to third superconductor current limiters has a highest critical current, wherein, during a time interval defined by a maximum time tolerated for a fault, said highest critical current delivers a particular charge, wherein said particular charge, when divided by a nominal voltage on said first and second terminals, defines a particular capacitance, wherein said current injector has a capacitance that is connected between said node and ground and that is greater than or equal to said particular capacitance.

5. The apparatus of claim 1, further comprising a control circuit for controlling said first, second, and third controlled switches, wherein said controller is configured to measure voltages at said terminals of said first, second, and third current limiters and to measure currents passing through said first, second, and third current limiters, wherein said control circuit is further configured to determine that a voltage across a particular current limiter exceeds a first threshold and that a current through said particular current limiter exceeds a second threshold, and, upon making such a determination, to cause a particular controlled switch to open, wherein said particular current limiter is selected from the group consisting of said first current limiter, said second current limiter, and said third current limiter, and wherein said particular controlled switch is in series with said particular current limiter.

6. The apparatus of claim 1, further comprising a control circuit for controlling said first, second, and third controlled switches, wherein said control circuit is configured to generate a command to open a particular controlled switch upon detecting that a square of a voltage at terminals of a particular current limiter exceeds a third threshold, wherein said particular current limiter is selected from the group consisting of said first current limiter, said second current limiter, and said third current limiter, and wherein said particular controlled switch is in series with said particular current limiter.

7. The apparatus of claim 1, further comprising a control circuit for controlling said first, second, and third controlled switches, wherein said control circuit is configured to generate a command to open a particular controlled switch upon detecting that a ratio of a voltage across said first current limiter and current through said first limiter exceeds a fourth threshold, wherein said particular current limiter is selected from the group consisting of said first current limiter, said second current limiter, and said third current limiter, and wherein said particular controlled switch is in series with said particular current limiter.

8. The apparatus of claim 5, wherein said control circuit is configured to generate said command to open said first controlled-switch no more than one millisecond after the crossing of one of the first and second thresholds.

9. The apparatus of claim 6, wherein said control circuit is configured to generate said command to open said first controlled-switch no more than one millisecond after the crossing of the third threshold.

10. The apparatus of claim 1, wherein each of said terminals is configured to sustain a voltage at least equal to ten thousand volts and a current that is at least equal to one thousand amperes.

11. The apparatus of claim 1, wherein said first, second, and third controlled switches are electromechanical switches, each of which has a breaking time of between five milliseconds and fifty milliseconds.

12. The apparatus of claim 1, further comprising high-voltage lines, wherein said item of interconnection equipment is one of three identical items of interconnection equipment, and wherein first and second terminals of each of said items of interconnection equipment are interconnected via said high-voltage lines, wherein said high-voltage lines and said items of interconnection equipment define a high-voltage direct current electrical network.

* * * * *